(12) United States Patent
Childress et al.

(10) Patent No.: US 7,043,823 B2
(45) Date of Patent: May 16, 2006

(54) METHOD OF MANUFACTURING A CURRENT-PERPENDICULAR-TO-PLANE MAGNETORESISTIVE DEVICE WITH OXIDIZED FREE LAYER SIDE REGIONS

(76) Inventors: Jeffrey R. Childress, 1039 Nightfall Ct., San Jose, CA (US) 95120; Elizabeth A. Dobisz, 6543 Cobblestone Ct., San Jose, CA (US) 95120; Robert E. Fontana, Jr., 6596 Northridge Dr., San Jose, CA (US); Kuok San Ho, 5618 Stevens Creek, Apt. 239, Cupertino, CA (US) 95014; Ching Hwa Tsang, 882 Helena Dr., Sunnyvale, CA (US) 94087; Son Van Nguyen, 16075 Blossom Hill Rd., Los Gatos, CA (US) 95032

( * ) Notice: Subject to any disclaimer, the term of this patent is extended or adjusted under 35 U.S.C. 154(b) by 0 days.

(21) Appl. No.: 10/869,590

(22) Filed: Jun. 15, 2004

(65) Prior Publication Data
US 2004/0223267 A1  Nov. 11, 2004

Related U.S. Application Data

(62) Division of application No. 10/174,866, filed on Jun. 17, 2002, now abandoned.

(51) Int. Cl.
*G11B 5/127* (2006.01)
*B44C 1/22* (2006.01)

(52) U.S. Cl. .............. 29/603.07; 29/603.12; 29/603.13; 29/603.14; 29/603.15; 29/603.16; 29/603.18; 360/313; 360/324.2; 216/22; 216/40; 216/41

(58) Field of Classification Search ............. 29/603.07, 29/603.12, 603.13, 603.14, 603.15, 603.16, 29/603.18, 603.08; 360/313, 320, 322, 324.2; 216/22, 40, 41, 47
See application file for complete search history.

(56) References Cited

U.S. PATENT DOCUMENTS

| | | | | | |
|---|---|---|---|---|---|
| 2,960,471 A | * | 11/1960 | Gorter | ............... | 252/62.59 X |
| 5,491,600 A | * | 2/1996 | Chen et al. | ............ | 360/322 X |
| 5,637,235 A | * | 6/1997 | Kim et al. | ................ | 216/22 |

(Continued)

FOREIGN PATENT DOCUMENTS

JP      2001-68760     * 3/2001

OTHER PUBLICATIONS

A. Tanaka et al., "Spin-Valve Heads in the Current-Perpendicular-to-Plane Mode for Ultrahigh-Density Recording", IEEE Transactions on Magnetics, vol. 38, No. 1, Jan. 2002, pp. 84-88.

*Primary Examiner*—A. Dexter Tugbang
(74) *Attorney, Agent, or Firm*—Thomas R. Berthold; Daniel E. Johnson

(57) ABSTRACT

A current-perpendicular-to the-plane (CPP) magnetoresistive device, such as a magnetic tunnel junction (MTJ), is formed by patterning a capping layer (e.g., using resist) in the shape of a central region of an underlying free ferromagnetic layer that in turn resides over additional layers of the MTJ. Side regions of the capping layer are removed by ion milling or etching down into the free ferromagnetic layer. Unmasked side regions of the ferromagnetic layer are then oxidized to render them locally non-ferromagnetic and electrically insulating.

24 Claims, 7 Drawing Sheets

U.S. PATENT DOCUMENTS

| | | |
|---|---|---|
| 5,650,958 A | 7/1997 | Gallagher et al. |
| 5,691,865 A | 11/1997 | Johnson et al. |
| 5,729,410 A | 3/1998 | Fontana, Jr. et al. |
| 5,835,314 A | 11/1998 | Moodera et al. |
| 5,841,692 A | 11/1998 | Gallagher et al. |
| 5,898,548 A | 4/1999 | Dill et al. |
| 6,451,215 B1 | 9/2002 | Shimazawa et al. |
| 6,542,342 B1 | 4/2003 | Hayashi et al. |
| 6,594,122 B1 | 7/2003 | Shukh |
| 6,600,638 B1 | 7/2003 | Gill |
| 6,621,666 B1 | 9/2003 | Miyauchi et al. |
| 6,633,461 B1 | 10/2003 | Gill |

\* cited by examiner

METHOD OF MANUFACTURING A CURRENT-PERPENDICULAR-TO-PLANE MAGNETORESISTIVE DEVICE WITH OXIDIZED FREE LAYER SIDE REGIONS

This application is a division of, and claims priority to, application Ser. No. 10/174,866 titled "Current-perpendicular-to-plane magnetoresistive device with oxidized free layer side regions and method for its fabrication", filed Jun. 17, 2002 now abandoned, which is hereby incorporated by reference in its entirety.

TECHNICAL FIELD

The invention relates generally to a current-perpendicular-to-the-plane (CPP) magnetoresistive device that operates with the sense current directed perpendicularly to the planes of two ferromagnetic layers separated by a nonmagnetic spacer layer, and more particularly to a magnetic tunnel junction (MTJ) type of CPP device and method for its fabrication.

BACKGROUND OF THE INVENTION

A magnetic tunnel junction (MTJ) has two metallic ferromagnetic layers separated by a very thin nonmagnetic insulating tunnel barrier layer, wherein the tunneling current perpendicularly through the layers depends on the relative orientation of the magnetizations in the two ferromagnetic layers. The high magnetoresistance at room temperature and generally low magnetic switching fields of the MTJ makes it a promising candidate for the use in magnetic sensors, such as a read head in a magnetic recording disk drive, and non-volatile memory elements or cells for magnetic random access memory (MRAM).

IBM's U.S. Pat. No. 5,650,958 describes an MTJ for use as a magnetoresistive read head and as a non-volatile memory cell wherein one of the ferromagnetic layers has its magnetization fixed, such as by being pinned by exchange coupling with an adjacent antiferromagnetic layer, and the other ferromagnetic layer is "free" to rotate in the presence of an applied magnetic field in the range of interest of the read head or memory cell. When the MTJ is a disk drive magnetoresistive read head, the magnetization of the fixed or pinned ferromagnetic layer will be generally perpendicular to the plane of the disk, and the magnetization of the free ferromagnetic layer will be generally parallel to the plane of the disk but will rotate slightly when exposed to magnetic fields from the recorded data on the disk. When the MTJ is a memory cell, the magnetization of the free ferromagnetic layer will be either parallel or antiparallel to the magnetization of the pinned ferromagnetic layer.

IBM's U.S. Pat. No. 5,729,410 describes an MTJ magnetoresistive read head with longitudinal biasing of the free ferromagnetic layer in which the MTJ device has electrical leads that connect to the sense circuitry. The leads are in contact with the insulating material in the read gap and the gap material is in contact with the magnetic shields so that the leads are electrically insulated from the shields. IBM's U.S. Pat. No. 5,898,548 describes an MTJ magnetoresistive read head with a narrow gap in which the leads are in direct contact with the magnetic shields, so that the shields also carry current from the sense circuitry.

In addition to MTJ devices, there are other current-perpendicular-to-the-plane (CPP) sensors that operate with the sense current directed perpendicularly to the planes of two ferromagnetic layers separated by a nonmagnetic spacer layer. One other type of CPP sensor is a spin-valve (SV) sensor in which the nonmagnetic spacer layer is electrically conductive. Thus in a MTJ magnetoresistive read head, the spacer layer is typically alumina ($Al_2O_3$) while in a CPP SV magnetoresistive read head the spacer layer is typically copper. CPP SV read heads are described by A. Tanaka et al., "Spin-valve heads in the current-perpendicular-to-plane mode for ultrahigh-density recording", *IEEE TRANSACTIONS ON MAGNETICS*, 38 (1): 84–88 Part 1 January 2002.

In the previously cited '958 patent, the pinned ferromagnetic layer is the lower ferromagnetic layer and has an outer perimeter greater than that of the upper free ferromagnetic layer. This MTJ device is patterned by ion milling down through the upper free ferromagnetic layer, stopping at the barrier layer. Alumina is then deposited on the sides of the free ferromagnetic layer on top of the barrier layer. The ion milling process suffers from the disadvantages of redeposition of conductive material and the inability to precisely control the removal process due to uncertainties in the ion milling rate and film thicknesses, which makes it difficult to avoid damaging the pinned ferromagnetic layer.

What is needed is an MTJ device with a pinned ferromagnetic layer having an outer perimeter greater than that of the free ferromagnetic layer and that can be fabricated without the disadvantages of the prior art ion milling process.

SUMMARY OF THE INVENTION

The invention is a CPP device wherein the free ferromagnetic layer has a central region of ferromagnetic material defined by side edges, and non-ferromagnetic side regions adjacent the edges of the central region formed of one or more oxides of the ferromagnetic material. In one embodiment the device is a MTJ magnetoresistive read head formed between two magnetic shields, with the pinned ferromagnetic layer on a first nonmagnetic spacer on the bottom shield, the insulating tunnel barrier layer on the pinned layer, the free ferromagnetic layer on the tunnel barrier layer, a second nonmagnetic spacer on the free ferromagnetic layer and the top shield on the free ferromagnetic layer. The pinned layer has a width and height greater than the width and height, respectively, of the overlying central region of the free layer, with the regions of the free layer other than the central region being oxidized and therefore non-ferromagnetic. The MTJ read head is formed by patterning resist in the shape of the free layer central region over the stack of layers in the MTJ, ion milling the stack down into the free layer, and then exposing the stack to oxygen to oxidize the ferromagnetic material in the side regions not covered by the resist. The material of the free layer as deposited is an alloy comprising Fe and one or more of Co and Ni, which remains in the central region, with the side regions becoming one or more non-ferromagnetic oxides of Fe and Co and/or Ni. Additional insulating material different from the oxides, such as $Al_2O_3$ or $SiO_2$, can be formed as cover layers over the non-ferromagnetic side regions of the free layer.

DETAILED DESCRIPTION OF THE INVENTION

Prior Art

Figure 1:
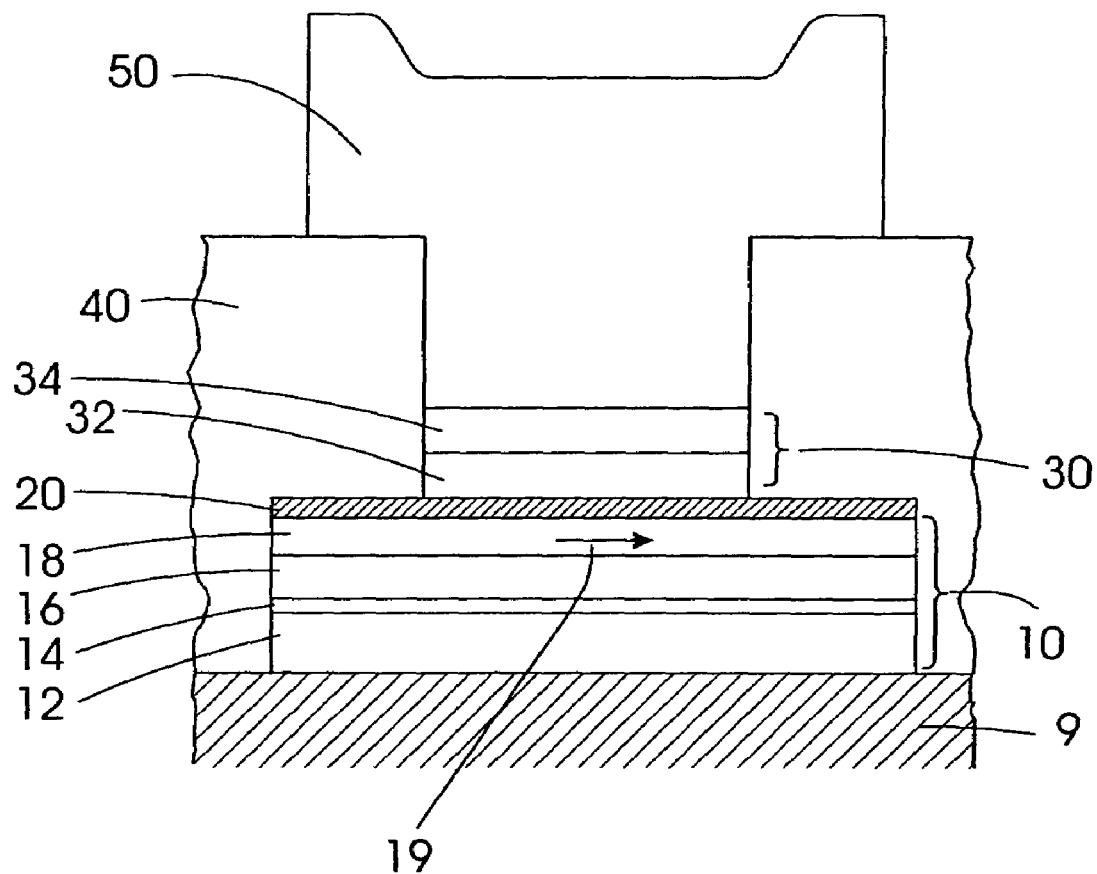
FIG. 1 is a cross-sectional view of a conventional prior art MTJ device.

FIG. 1 illustrates in cross-sectional view a conventional prior art MTJ device. The device includes a substrate 9, a base multilayer stack 10, a spacer layer of an insulating tunnel barrier layer 20, a top stack 30, an insulating layer 40 surrounding top stack 30 and bottom stack 10, and a top wiring layer or electrical lead 50. The tunnel barrier layer 20 is sandwiched between the two stacks 10 and 30.

The base stack 10 formed on substrate 9 includes a first seed layer 12 deposited on substrate 9, an optional "template" ferromagnetic layer 14 on the seed layer 12, a layer of antiferromagnetic material 16 on the template layer 14, and a "pinned" ferromagnetic layer 18 formed on and exchange coupled with the underlying antiferromagnetic layer 16. The ferromagnetic layer 18 is called the pinned layer because its magnetization direction (shown by arrow 19) is prevented from rotation in the presence of applied magnetic fields in the desired range of interest for the MTJ device, i.e., the field from the write current if the device is a MTJ memory cell, or the field from the data recorded on the disk if the device is a MTJ read head. The top electrode stack 30 includes a "free" ferromagnetic layer 32 and a protective or capping layer 34 formed on the free layer 32. The magnetization direction of the ferromagnetic layer 32 is not pinned by exchange coupling, and is thus free to rotate in the presence of applied magnetic fields in the range of interest. When the device is an MTJ memory cell, the magnetization direction of ferromagnetic layer 32 will be either parallel or antiparallel to the magnetization direction 19 of pinned ferromagnetic layer 18. When the device is an MTJ sensor, such as a disk drive read head, the magnetization direction of pinned ferromagnetic layer 18 will be oriented into the paper in FIG. 1 and the magnetization direction of free ferromagnetic layer 32 will be oriented in the plane of the paper in FIG. 1 (perpendicular to the magnetization direction of pinned ferromagnetic layer 18) in the absence of an applied magnetic field, but will rotate slightly when exposed to a magnetic field from the recorded data on the disk, as described in the previously cited '410 patent.

The materials for MTJ devices with the structure illustrated in FIG. 1 are well known, and representative ones will be described. The MTJ base stack 10 comprises a stack of 200 Å Pt/40 Å $Ni_{81}Fe_{19}$/100 Å $Mn_{50}Fe_{50}$/80 Å $Ni_{81}Fe_{19}$ (layers 12, 14, 16, 18, respectively) grown on substrate 9. In addition to Pt, other conducting underlayers include Ta, Cu and Au. Other CoFe and NiFe alloys may be used for the ferromagnetic layers and other antiferromagnetic materials include NiMn, PtMn and IrMn. Substrate 9 would be a silicon wafer if the device is a memory cell. Substrate 9 would typically be the bottom electrically conductive lead located on either the alumina gap material or the magnetic shield material on the trailing surface of the head carrier if the device is a read head, as shown in the previously cited '410 patent. The stack 10 is grown in the presence of a magnetic field applied parallel to the surface of the substrate wafer. The magnetic field serves to orient the $Mn_{50}Fe_{50}$ antiferromagnetic layer 16. Layer 16 pins the magnetization direction of the NiFe free ferromagnetic layer 18 by exchange coupling. Next, the tunnel barrier layer 20 is formed by depositing and then oxidizing a 5–15 Å Al layer. This creates the $Al_2O_3$ insulating tunnel barrier layer 20. While $Al_2O_3$ is the most common tunnel barrier material, a wide range of other materials may be used, including MgO, AlN, aluminum oxynitride, oxides and nitrides of gallium and indium, and bilayers and trilayers of such materials. The MTJ top stack 30 is an 80 Å Co/200 Å Pt stack (layers 32, 34, respectively) having a cross-sectional area of a few square microns or less. The free ferromagnetic layer 32 is preferably either a single layer of an alloy of Fe and one or more of Co and Ni, or a bilayer of a CoFe alloy and a NiFe alloy. The top stack 30 is surrounded by an insulation layer 40, which is typically $SiO_2$ if the device is a memory cell and alumina if the device is a read head. The junction is contacted by a 200 Å Ag/3000 Å Au contact layer 50 that serves as the top wiring lead. Other capping or lead materials include Ta, Ti, Ru and Rh.

This MTJ structure is fabricated by sputtering all the layers in the junction stack (layers 12, 14, 16, 18, 20, 32, 34) onto the substrate 9, followed by ion milling down through the free ferromagnetic layer 32 to the barrier layer 20. This process of direct subtractive removal of the free ferromagnetic layer by ion milling or reactive ion etching (RIE) suffers from the disadvantages of redeposition of conductive material, inability to precisely control the removal process, and ion damage that can extend 20–40 Å below the etched surface. The ion milling or RIE of the free layer and pinned layer can cause redeposition of the material in these layers onto the edges of the tunnel barrier layer 20 and electrically "short" the insulating tunnel barrier at its edges. In addition, uncertainties in the ion milling rate and film thicknesses make it difficult to avoid damaging the underlying layers. Typical ion milling rates are 1 Å/sec for capping material (Ta) and free layer material (NiFe or CoFe). Typical capping layer thickness is 100 Å to 200 Å and typical free layer thickness is 30 Å to 40 Å. The film thickness uniformity and ion mill removal rate uniformity are each approximately 5%. Thus the use of ion milling or RIE to precisely remove the capping layer 34 and free layer 32 and stop at the tunnel barrier layer 20 has an inherent uncertainty of 13 Å to 24 Å in the removal process. This uncertainty is greater than or equivalent to the thickness of the tunnel barrier layer 20.

The Invention

Figure 2:
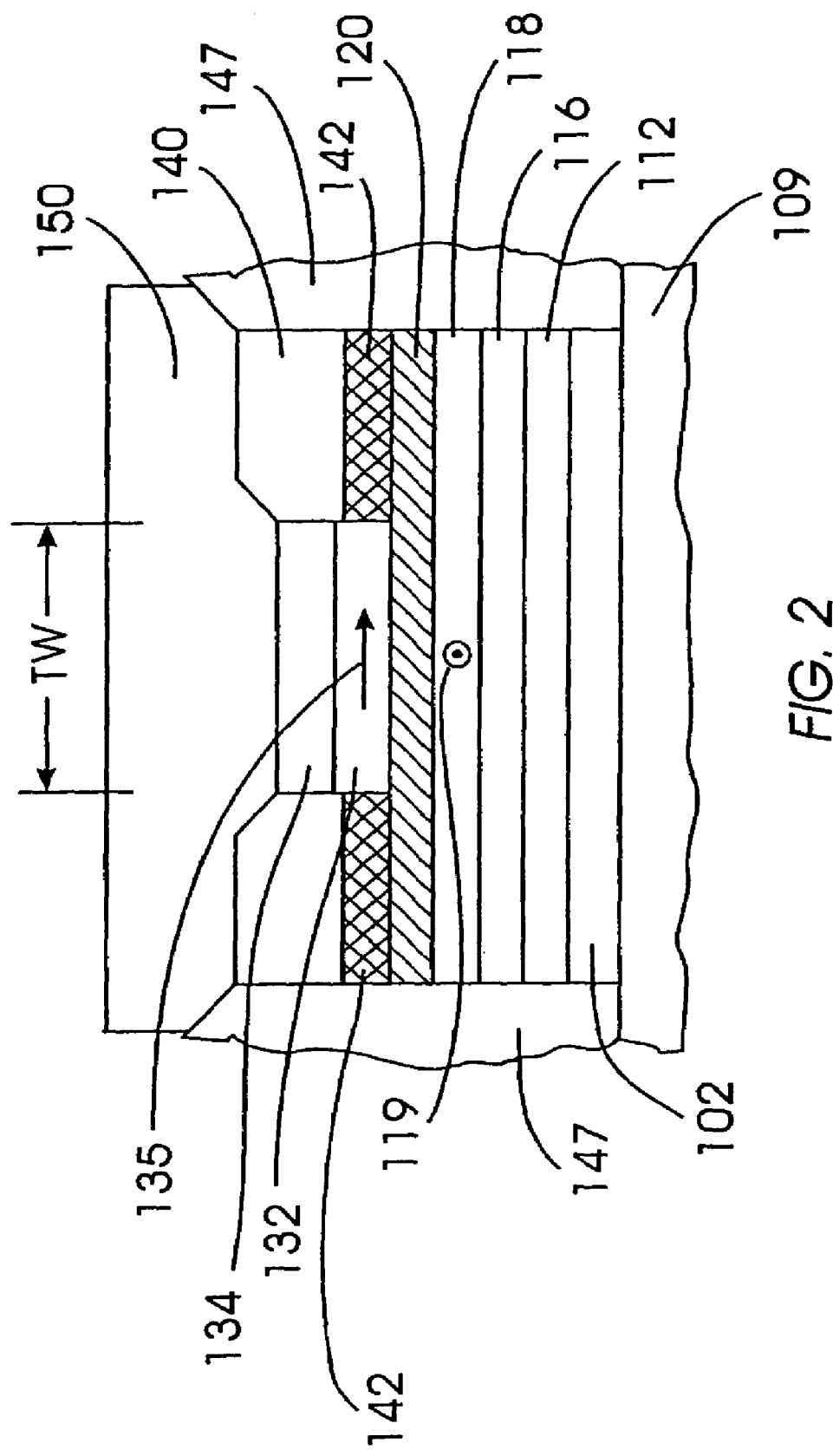
FIG. 2 is a cross-sectional view of the MTJ device of the present invention in the form of an MTJ read head for a magnetic recording disk drive.

The MTJ device of the present invention is shown in FIG. 2 in the form of an MTJ read head for a magnetic recording disk drive. The cross-sectional view of FIG. 2 is essentially the read head as would be viewed from the disk with "TW" representing the trackwidth of the data tracks on the disk. The layers formed on the substrate 109, which is typically the permalloy (NiFe) bottom shield or the alumina gap material in the head structure, are the bottom electrical lead layer 102, seed layer 112, antiferromagnetic layer 116, fixed or pinned ferromagnetic layer 118 with its magnetization direction 119 being shown as into the paper, nonmagnetic insulating tunnel barrier layer 120, free ferromagnetic layer 132 with its magnetization direction 135 being in the plane of the paper and perpendicular to direction 119 in the absence of an applied field from the recorded data on the disk, capping layer 134 and top electrical lead 150. The top magnetic shield (not shown) or alumina gap material (not shown) would then be formed on top lead 150, as depicted in the previously cited '410 and '548 patents. The bottom lead 102 and top lead 150 are formed of nonmagnetic materials and thus serve as first and second spacer layers to separate the ferromagnetic layers of the device from the bottom magnetic shield 109 and top magnetic shield, respectively.

Typical material compositions and thicknesses for layers 102 through 134 are as follows:

20–50 Å Ru or Ta lead layer/20–50 Å NiFe or NiFeCr seed layer/200 Å PtMn or IrMn antiferromagnetic layer/30 Å NiFe or CoFe or NiFe—CoFe bilayer pinned layer/10–20 Å $Al_2O_3$ tunnel barrier layer/30 Å NiFe or CoFe or CoFe—NiFe bilayer free layer/50–100 Å Ta, Ru or Ti capping layer. The device is similar to the prior art FIG. 1 with the primary difference being that there are non-ferromagnetic side regions 142 adjacent free layer 132 that are formed of oxides of the ferromagnetic material making up free layer 132. The side regions 142 are formed by selectively oxidizing the free layer to render it locally non-ferromagnetic (substantially incapable of conducting magnetic flux) and electrically insulating. Insulating alumina is located in outer regions 147 surrounding the outer side regions 142. Additional alumina is located in outer regions 147 surrounding the outer edges of the tunnel barrier layer 120 and the layers beneath it. Covers 140 and outer regions 147 may be formed of other insulating material, such as $SiO_2$.

Figure 3:
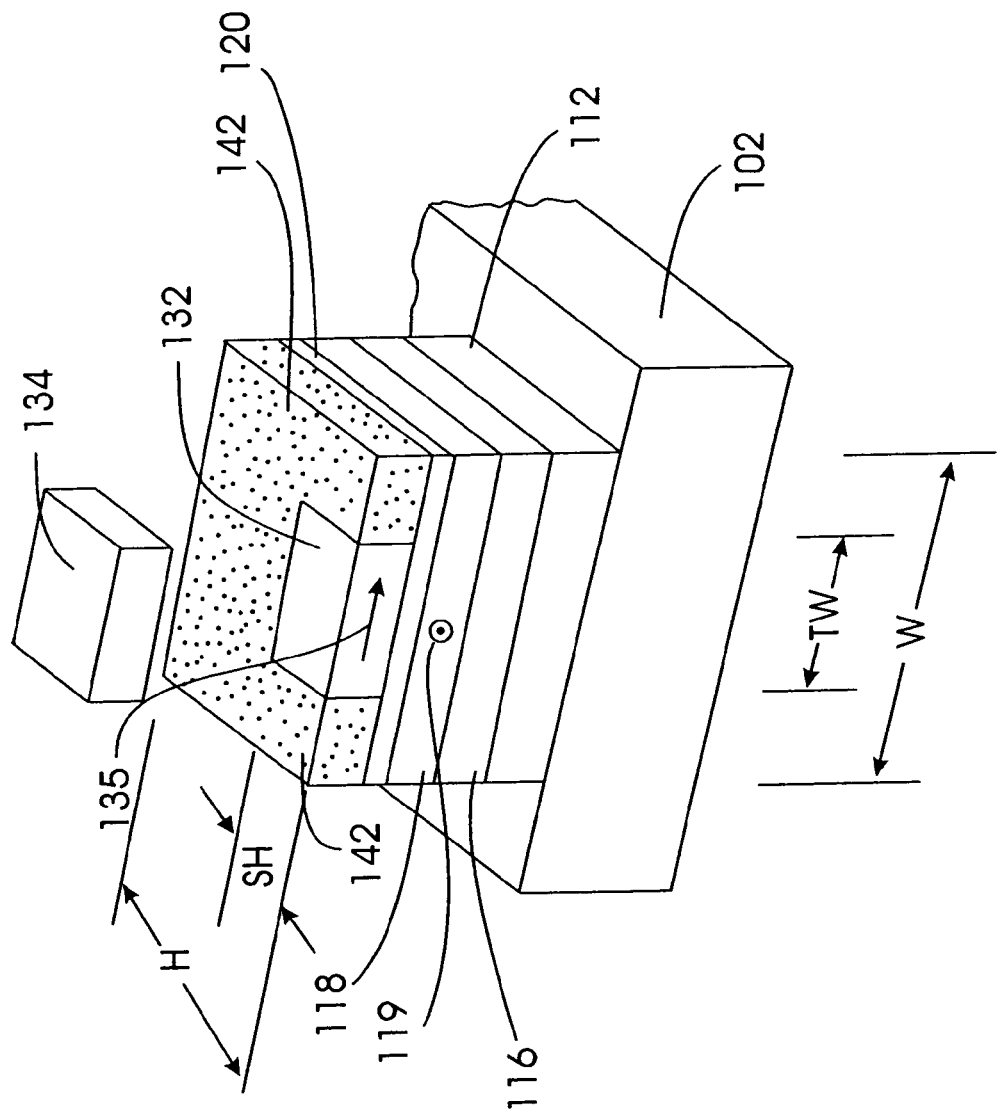
FIG. 3 is a perspective view of the MTJ read head of FIG. 2 with the top lead, insulating covers and insulating outer regions removed.

FIG. 3 is a perspective view of the MTJ read head with the top lead 150 and alumina covers 140 and outer regions 147 removed. Because the pinned layer 118 has a width W wider than the width (trackwidth TW) of the free layer 132 in the trackwidth direction, better longitudinal biasing of the free layer in this direction is achieved since the edge domain effects of the pinned layer are physically separated from the edges of the free layer by the non-ferromagnetic side regions 142. FIG 3 also illustrates that the pinned layer 118 can have a height H greater than the height (stripe height SH) of the free layer 132 in the stripe height dimension perpendicular to the trackwidth dimension. Because the pinned layer 118 can be formed with an aspect ratio (H/W) greater than unity, better stabilization of the pinned layer magnetization direction 119 along its height H can be achieved.

The MTJ device of the present invention is fabricated using controlled oxidation of selected regions 142 of the free layer 132 to render the free layer non-ferromagnetic and non-conducting in these selected regions above the pinned layer 118. The oxidation process does not penetrate the previously oxidized tunnel barrier layer 120 and therefore can not damage the underlying pinned layer.

Figure 4A:
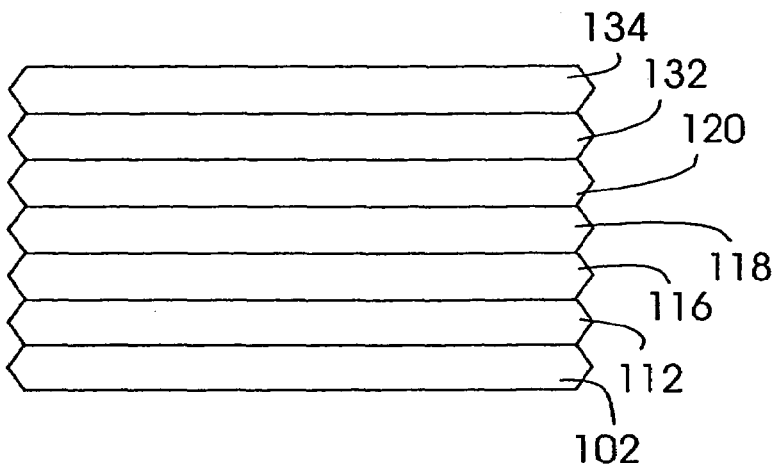
FIGS. 4A–4I illustrate the process sequence for forming the MTJ read head of the present invention with the selective oxidation process to form the oxidized side region of the free layer.
Figure 4B:
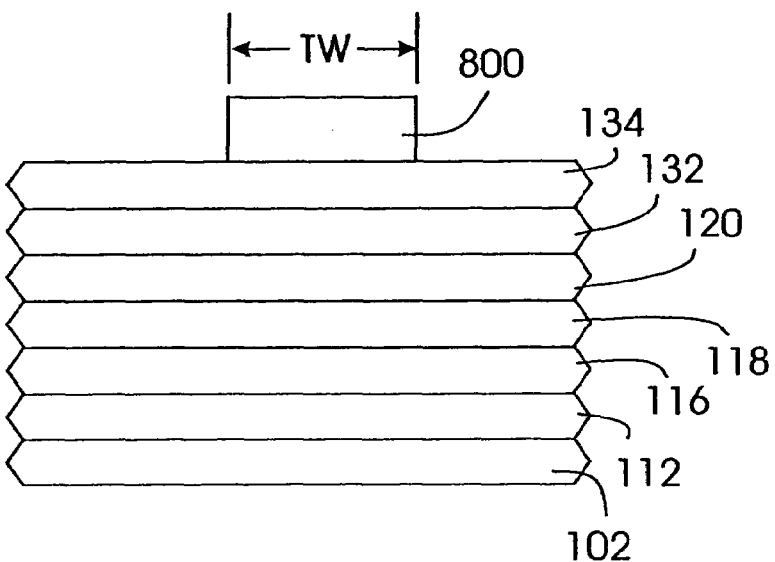
Figure 4C:
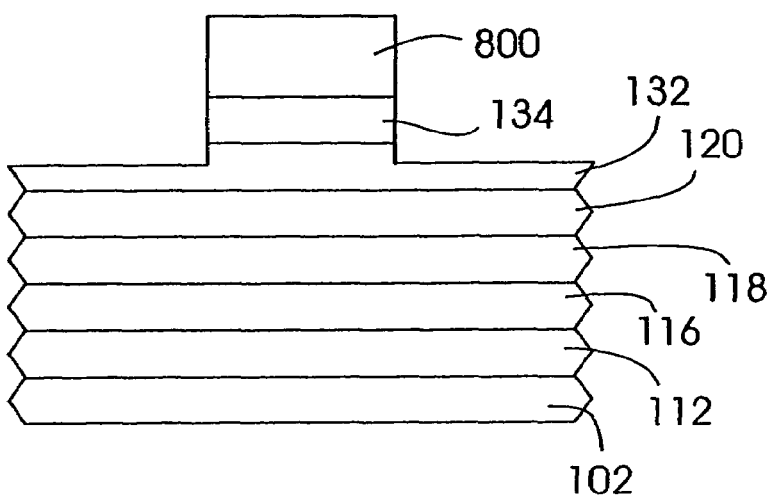

FIGS. 4A–4I illustrate the process sequence for forming the MTJ device with the selective oxidation process. The process begins (FIG. 4A) by sputter depositing on the substrate (not shown) the MTJ layers 102 through 118 followed by a layer of Al, typically 5–15 Å thick. The Al is then oxidized by evacuation of the Ar sputtering gas and then either introduction of oxygen or exposure to an oxygen plasma. This forms the alumina ($Al_2O_3$) tunnel barrier layer 120, typically 10–20 Å thick. The remaining layers 132 and 134 are then sputter deposited over the tunnel barrier layer, resulting in the stack shown in FIG. 4A. A mask of resist 800 is then patterned on a central region of the capping layer 134 to define the lateral edges (TW and SH) of the free layer 132, as shown in FIG. 4B. The stack is then moved to the RIE or ion milling tool where it is etched through the capping layer 134 and ending at or into the free layer 132 (FIG. 4C).

Figure 4D:
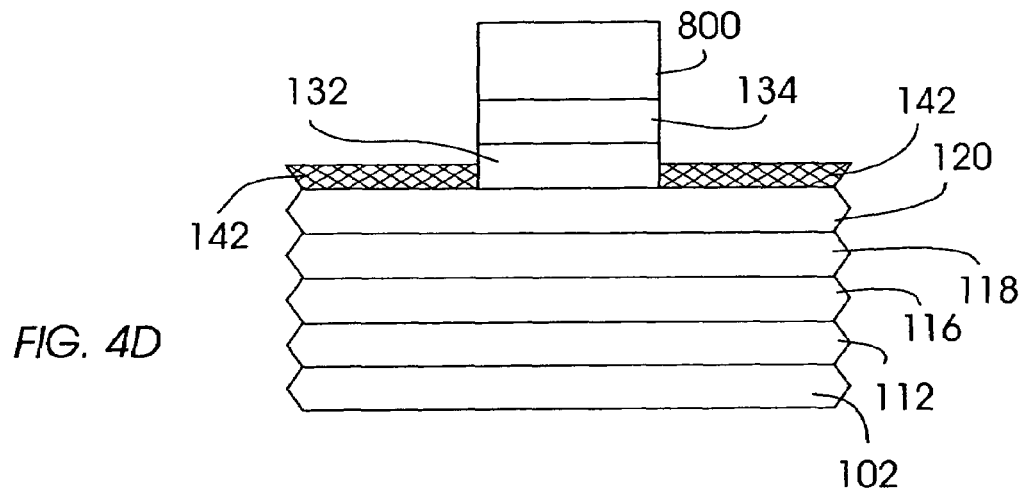
Figure 4E:
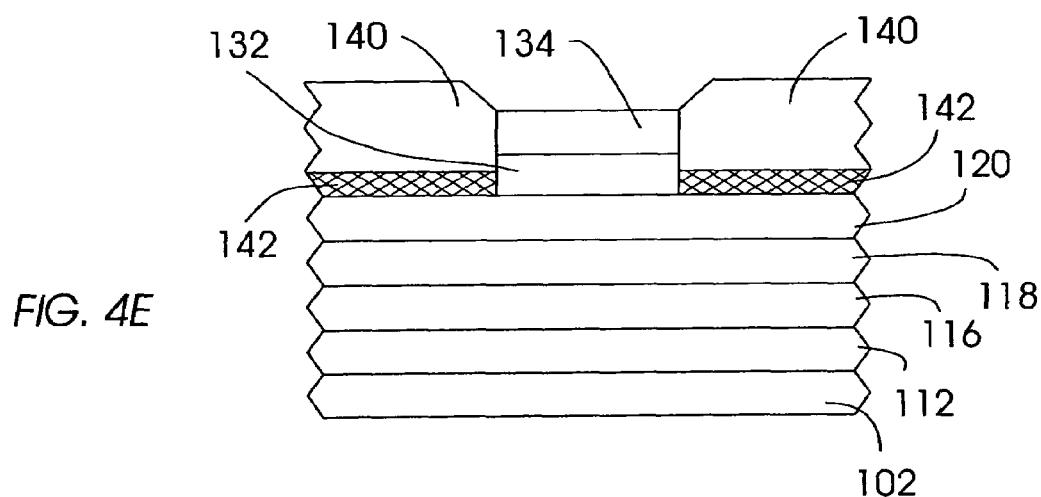

Next, the exposed portions of free layer 132 are oxidized in the RIE or ion milling tool to render these regions 142 of the free layer non-ferromagnetic and non-conducting (FIG. 4D). Suitable oxidation processes include ozone treatment, air oxidation, thermal oxidation, plasma oxidation, electrolytic oxidation, implantation of oxygen or molecular oxygen ($O_2$, $O_3$) ions or neutrals. Reactive oxygen plasma induced oxidation can be performed in a RF coupled plasma, electron cyclotron resonance coupled plasma, or an inductively coupled plasma (ICP) system. A preferred process for oxidation of the free layer is with an ICP tool, which generates a dense plasma of oxygen radicals and allows the substrate bias to be controlled separately from the plasma source. When etching a test wafer with photoresist in the ICP system in an oxygen plasma under our typical plasma oxidation conditions, the etch rate is uniform across an entire 5 inch wafer to within 3%. The ICP oxidation process that induced demagnetization of the ferromagnetic layer had parameters of 30 sccm $O_2$/min, 20° C. substrate temperature, 10 mT chamber pressure, 50 W @13.56 MHz applied to the source coils, and 18 W @13.56 MHz applied to the substrate.

Figure 4F:
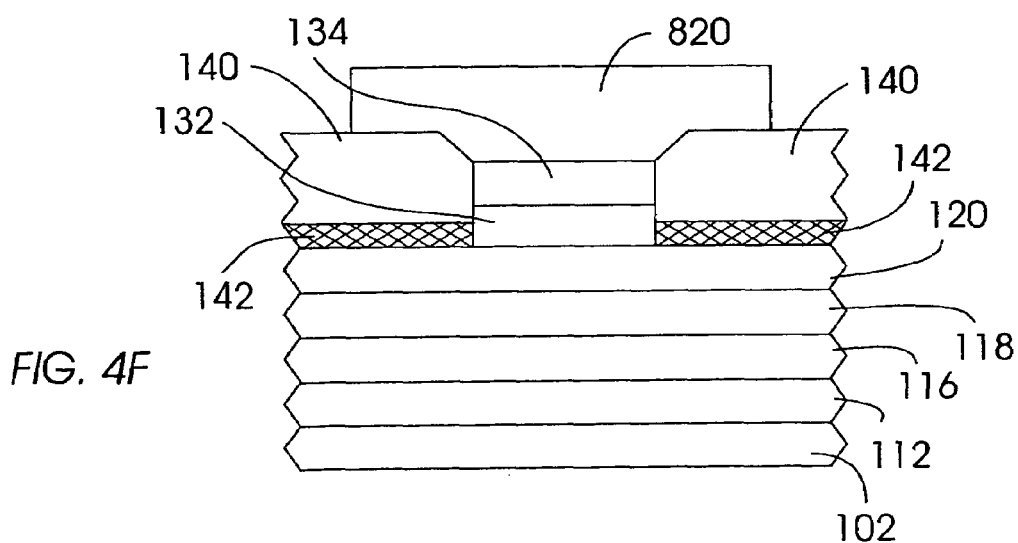
Figure 4G:
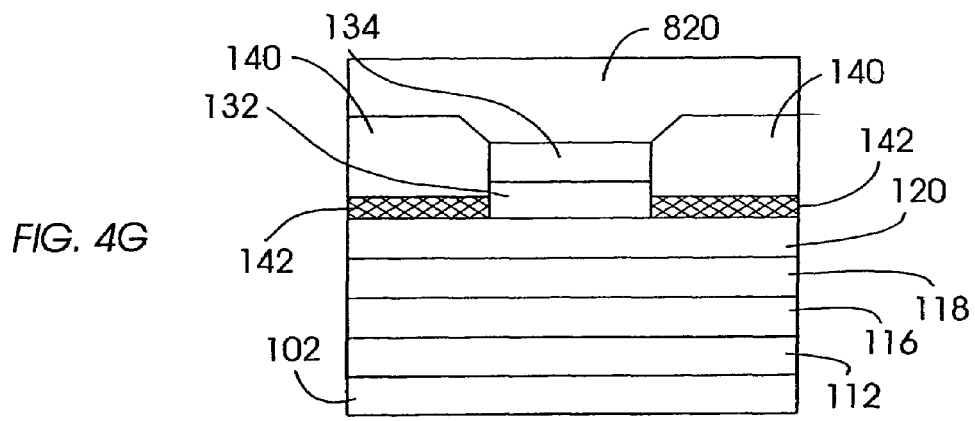
Figure 4H:
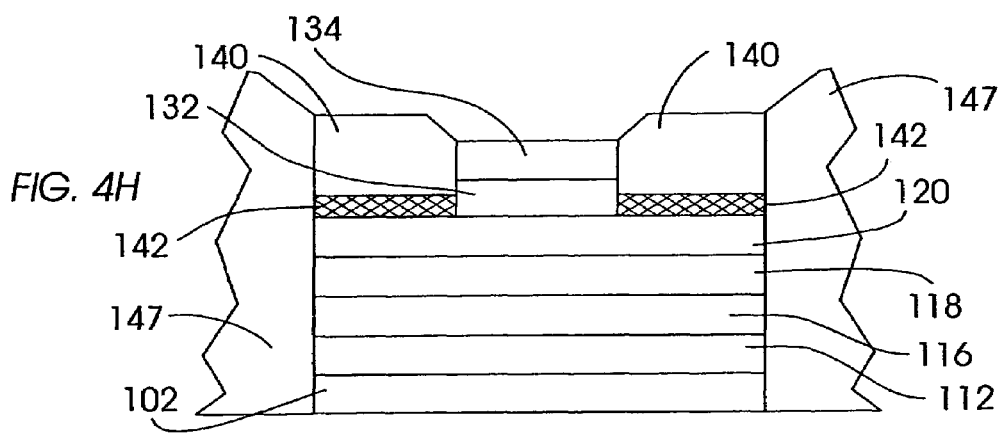
Figure 4I:
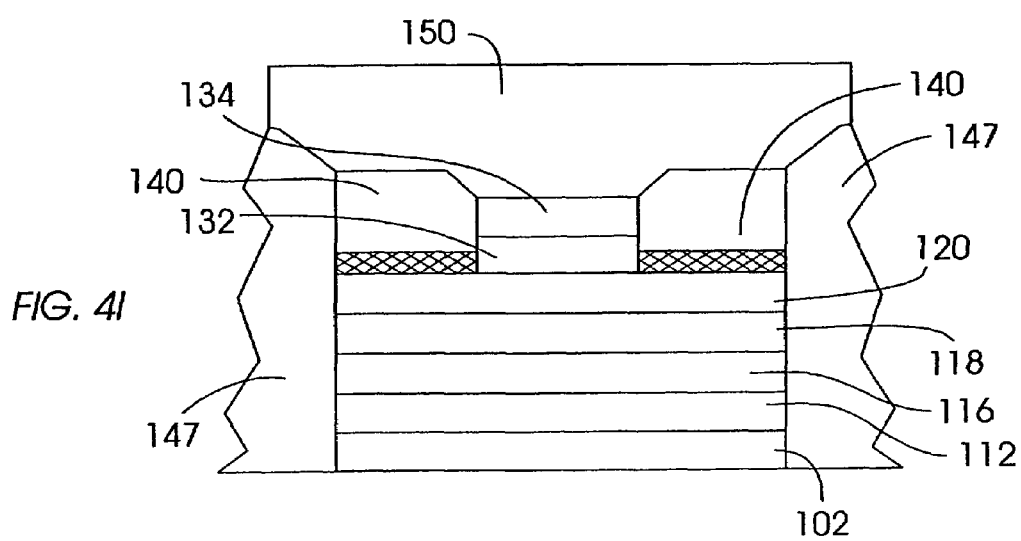
Figure 5:
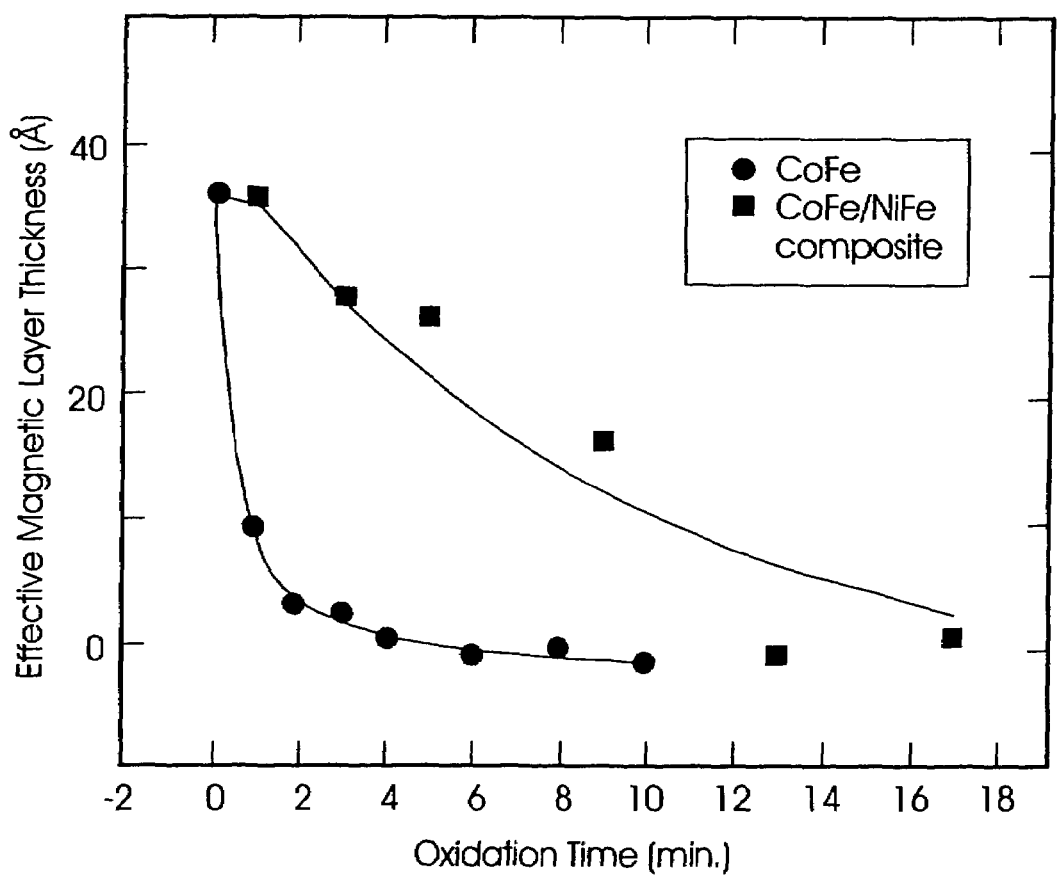
FIG. 5 is a graph showing the effect of oxidation on the ferromagnetic free layer material vs. time.

The regions 142 become oxides of the material in the free layer 132, e.g., one or more oxides of Fe and Co and/or Ni. Because the underlying layer 120 is already oxidized, the oxidation process is self-limiting, so control of the oxidation time is not critical. Next, insulation material, typically alumina or $SiO_2$, is deposited to form covers 140 above the non-ferromagnetic side regions 142, followed by lift-of of the resist 800, resulting in the structure shown in FIG. 4E. While the deposition of the covers 140 is preferred, this additional step may not be necessary if the oxide regions 142 are sufficiently free of pin holes. New resist 820 is then patterned to define the outside lateral extent of the pinned layer 118 as well as the other layers in the stack (FIG. 4F). The stack is then ion milled or RIB to remove all the layers down to the substrate (FIG. 4G), and an insulating layer of alumina or $SiO_2$ is then deposited to form the outer regions 147 (FIG. 4H). Finally the top electrical lead 150, typically 200 Å of Ta, Au or Cu, is deposited and patterned over the capping layer 134 (FIG. 4I). FIG. 5 is a graph showing the effect of oxidation on the effective ferromagnetic layer thickness (as calculated from measurements of magnetic moment) vs. time. Shown in the plot are data points for two compositions: a 31 Å CoFe single layer and a 10 Å CoFe/32 Å NiFe bilayer. While these two compositions have different physical thicknesses, they each have substantially the same effective magnetic thicknesses as a 36 Å film of NiFe. The oxidation time was approximately 6 minutes to demagnetize the CoFe single layer, and approximately 14 minutes to demagnetize the CoFe/NiFe bilayer.

While the device and method for its fabrication have been described above with respect to an MTJ device, particularly an MTJ sensor in the form an MTJ read head, the invention is also applicable to current-perpendicular-to-the-plane or CPP spin-valve (SV) sensors. A CPP SV read head has a structure substantially the same as the above-described MTJ read head, with the exception that the spacer layer is electrically conductive instead of insulating. For example, a copper spacer layer can replace the alumina tunneling barrier layer.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a sensor comprising:
   depositing over a substrate in succession a layer of antiferromagnetic material, a first layer of ferromagnetic material, a spacer layer of non-ferromagnetic material, a second layer of ferromagnetic material, and a layer of capping material;
   providing a mask over a central region of the capping layer, the central region of the capping layer overlying a central region of the second ferromagnetic layer;
   removing side regions of the capping layer not covered by the mask and removing only a portion of the second ferromagnetic layer in side regions not covered by the mask, so that there is material remaining in the second ferromagnetic layer in the side regions not covered by the mask;
   oxidizing the material remaining in the second ferromagnetic layer in the side regions not covered by the mask without oxidizing the material in the central region of the second ferromagnetic layer; and
   removing the mask.

2. The method according to claim 1 further comprising depositing over the oxidized side regions electrically insulating cover material different from the material of the oxidized side regions.

3. The method according to claim 1 wherein depositing the non-ferromagnetic spacer layer comprises depositing electrically insulating material.

4. The method according to claim 3 wherein depositing electrically insulating material comprises depositing a layer of aluminum and then oxidizing the aluminum.

5. The method according to claim 1 wherein the substrate includes material selected from the group of materials consisting of NiFe and alumina.

6. The method according to claim 5 wherein an electrical lead layer is formed on the substrate, and a seed layer is formed on the electrical lead layer.

7. The method according to claim 1 further comprising forming an electrical lead layer over the capping layer.

8. The method according to claim 1 wherein said oxidizing is performed to achieve better longitudinal biasing of the second layer through physically separating edges of the first layer from edges of the second layer by the oxidized material of the second layer.

9. The method according to claim 1 wherein the first layer of ferromagnetic material is formed with an aspect ratio greater than unity to better stabilize the magnetization direction of the first layer.

10. The method according to claim 1 wherein said oxidizing does not damage the first layer.

11. The method according to claim 1 wherein the spacer layer is between 10 and 20 angstroms thick.

12. The method according to claim 1 wherein the oxidized material includes at least one oxide from the group of elements consisting of Fe, Co, and Ni.

13. The method according to claim 1 wherein the mask includes resist material, the method comprising lifting off the resist.

14. The method according to claim 13 further comprising:
   forming additional resist over the capping layer; and
   patterning the additional resist to define the outside lateral extent of the first layer.

15. The method according to claim 1 wherein the oxidation time is selected to demagnetize the remaining material of the second layer.

16. The method according to claim 1 wherein the spacer layer is electrically conductive.

17. A method for making a sensor comprising:
   depositing over a substrate in succession a layer of antiferromagnetic material, a first layer of ferromagnetic material, a spacer layer, a second layer of ferromagnetic material, and a layer of capping material;
   providing a mask over a central region of the capping layer, the central region of the capping layer overlying a central region of the second ferromagnetic layer;
   removing side regions of the capping layer not covered by the mask and removing at most a portion of the second ferromagnetic layer in side regions not covered by the mask, so that there is material remaining in the second ferromagnetic layer in the side regions not covered by the mask;
   oxidizing the material remaining in the second layer in the side regions not covered by the mask without oxidizing the material in the central region of the second layer, to render the side regions of the second layer substantially incapable of conducting magnetic flux; and
   removing the mask.

18. The method according to claim 17 wherein depositing the spacer layer comprises depositing electrically insulating material.

19. The method according to claim 17 wherein said oxidizing is performed to achieve better longitudinal biasing of the second layer through physically separating edges of the first layer from edges of the second layer by the oxidized material of the second layer.

20. The method according to claim 17 wherein said oxidizing does not damage the first layer.

21. The method according to claim 17 wherein the mask includes resist material, the method comprising lifting off the resist.

22. The method according to claim 21 further comprising:
   forming additional resist over the capping layer; and
   patterning the additional resist to define the outside lateral extent of the first layer.

23. The method according to claim 17 wherein the oxidation time is selected to demagnetize the remaining material of the second layer.

24. The method according to claim 17 wherein the spacer layer is electrically conductive.

* * * * *

UNITED STATES PATENT AND TRADEMARK OFFICE
CERTIFICATE OF CORRECTION

| | | |
|---|---|---|
| PATENT NO. | : 7,043,823 B2 | Page 1 of 1 |
| APPLICATION NO. | : 10/869590 | |
| DATED | : May 16, 2006 | |
| INVENTOR(S) | : Jeffrey Childress et al. | |

It is certified that error appears in the above-identified patent and that said Letters Patent is hereby corrected as shown below:

On the title page of the patent, add the following:

-- (73)   Assignee:   International Business Machines Corporation, Armonk, NY (US) --

Signed and Sealed this

Fifth Day of December, 2006

JON W. DUDAS
*Director of the United States Patent and Trademark Office*